(12) United States Patent
Muchherla et al.

(10) Patent No.: US 10,452,282 B2
(45) Date of Patent: Oct. 22, 2019

(54) MEMORY MANAGEMENT

(71) Applicant: Micron Technology, Inc., Boise, ID (US)

(72) Inventors: Kishore K. Muchherla, Fremont, CA (US); Sampath K. Ratnam, Boise, ID (US); Peter Feeley, Boise, ID (US); Michael G. Miller, Boise, ID (US); Preston A. Thomson, Boise, ID (US); Renato C. Padilla, Folsom, CA (US); Ashutosh Malshe, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 137 days.

(21) Appl. No.: 15/482,337

(22) Filed: Apr. 7, 2017

(65) Prior Publication Data

US 2018/0293003 A1    Oct. 11, 2018

(51) Int. Cl.
*G06F 12/02* (2006.01)
*G06F 3/06* (2006.01)
*G11C 16/10* (2006.01)
*G11C 16/16* (2006.01)
*G11C 16/34* (2006.01)
*G11C 11/56* (2006.01)

(52) U.S. Cl.
CPC ............ *G06F 3/0616* (2013.01); *G06F 3/064* (2013.01); *G06F 3/0652* (2013.01); *G06F 3/0679* (2013.01); *G11C 11/5628* (2013.01); *G11C 11/5635* (2013.01); *G11C 16/10* (2013.01); *G11C 16/16* (2013.01); *G11C 16/3495* (2013.01); *G11C 2211/5641* (2013.01)

(58) Field of Classification Search
None
See application file for complete search history.

(56) References Cited

U.S. PATENT DOCUMENTS

| | | |
|---|---|---|
| 6,732,221 B2 | 5/2004 | Ban |
| 7,701,768 B2 | 4/2010 | Hwang |
| 8,078,794 B2 | 12/2011 | Lee et al. |
| 8,639,877 B2 | 1/2014 | Benhase et al. |
| 8,832,506 B2 | 9/2014 | Griffin et al. |
| 9,146,851 B2 | 9/2015 | Pittelko |
| 9,195,588 B2 | 11/2015 | Cepulis |
| 2009/0327591 A1 | 12/2009 | Moshayedi |
| 2010/0332922 A1 | 12/2010 | Chang et al. |
| 2013/0275692 A1 | 10/2013 | Kwok |

(Continued)

OTHER PUBLICATIONS

International Search Report and Written Opinion from related International patent application No. PCT/US2018/024722, dated Jul. 13, 2018, 16 pp.

*Primary Examiner* — Charles Rones
*Assistant Examiner* — Ryan Dare
(74) *Attorney, Agent, or Firm* — Brooks, Cameron & Huebsch, PLLC

(57) ABSTRACT

The present disclosure includes memory blocks erasable in a single level cell mode. A number of embodiments include a memory comprising a plurality of mixed mode blocks and a controller. The controller may be configured to identify a particular mixed mode block for an erase operation and, responsive to a determined intent to subsequently write the particular mixed mode block in a single level cell (SLC) mode, perform the erase operation in the SLC mode.

5 Claims, 5 Drawing Sheets

(56) References Cited

U.S. PATENT DOCUMENTS

| | | | |
|---|---|---|---|
| 2014/0006688 A1* | 1/2014 | Yu | G11C 16/10 |
| | | | 711/103 |
| 2014/0059406 A1* | 2/2014 | Hyun | G11C 11/5621 |
| | | | 714/773 |
| 2014/0101499 A1 | 4/2014 | Griffin et al. | |
| 2014/0269069 A1* | 9/2014 | D'Abreu | G11C 16/16 |
| | | | 365/185.11 |
| 2015/0134885 A1 | 5/2015 | Yeung et al. | |
| 2015/0143035 A1* | 5/2015 | Choi | G06F 3/0661 |
| | | | 711/103 |
| 2015/0169228 A1* | 6/2015 | Sivasankaran | G06F 3/0625 |
| | | | 711/103 |
| 2016/0093394 A1* | 3/2016 | Lee | G11C 16/26 |
| | | | 365/185.12 |
| 2016/0266826 A1* | 9/2016 | Ooneda | G11C 29/789 |
| 2016/0284393 A1* | 9/2016 | Ramalingam | G11C 11/5628 |
| 2016/0364337 A1* | 12/2016 | Hale | G06F 12/0897 |
| 2016/0372199 A1* | 12/2016 | Shim | G11C 16/0483 |

\* cited by examiner

MEMORY MANAGEMENT

TECHNICAL FIELD

The present disclosure relates generally to semiconductor memory and methods, and more particularly, to memory management.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can retain stored data when not powered and can include NAND flash memory, NOR flash memory, phase change random access memory (PCRAM), resistive random access memory (RRAM), and magnetic random access memory (MRAM), among others.

Memory devices can be combined together to form a solid state drive (SSD). An SSD can include non-volatile memory (e.g., NAND flash memory and/or NOR flash memory), and/or can include volatile memory (e.g., DRAM and/or SRAM), among various other types of non-volatile and volatile memory. Flash memory devices can include memory cells storing data in a charge storage structure such as a floating gate, for instance, and may be utilized as non-volatile memory for a wide range of electronic applications. Flash memory devices typically use a one-transistor memory cell that allows for high memory densities, high reliability, and low power consumption.

An SSD can be used to replace hard disk drives as the main storage volume for a computer, as the solid state drive can have advantages over hard drives in terms of performance, size, weight, ruggedness, operating temperature range, and power consumption. For example, SSDs can have superior performance when compared to magnetic disk drives due to their lack of moving parts, which may avoid seek time, latency, and other electro-mechanical delays associated with magnetic disk drives.

Memory cells in an array architecture can be programmed to a target (e.g., desired) state. For instance, electric charge can be placed on or removed from the charge storage structure (e.g., floating gate) of a memory cell to program the cell to a particular data state. The stored charge on the charge storage structure of the memory cell can indicate a threshold voltage (Vt) of the cell, and the state of the cell can be determined by sensing the stored charge (e.g., the Vt) of the cell.

For example, a single level cell (SLC) can be programmed to a targeted one of two different data states, which can be represented by the binary units 1 or 0. Some flash memory cells can be programmed to a targeted one of more than two data states (e.g., 1111, 0111, 0011, 1011, 1001, 0001, 0101, 1101, 1100, 0100, 0000, 1000, 1010, 0010, 0110, and 1110) such that they represent more than one digit (e.g., more than one bit). Cells configured for programming to more than two data states may be referred to as extra level cells (XLC). For example, multilevel cells (MLCs), triple level cells (TLCs), and/or quad-level cells (QLCs) may be referred to generally herein as XLCs. XLCs can provide higher density memories for a given number of memory cells; however, XLCs may have a lower endurance and/or data retention capability as compared to SLCs. For example, an expected useful life of SLCs may be 50,000 to 100,000 cycles (e.g., program-erase cycles), while an expected useful life of XLCs may be 1,000 to 5,000 cycles.

DETAILED DESCRIPTION

Figure 1:
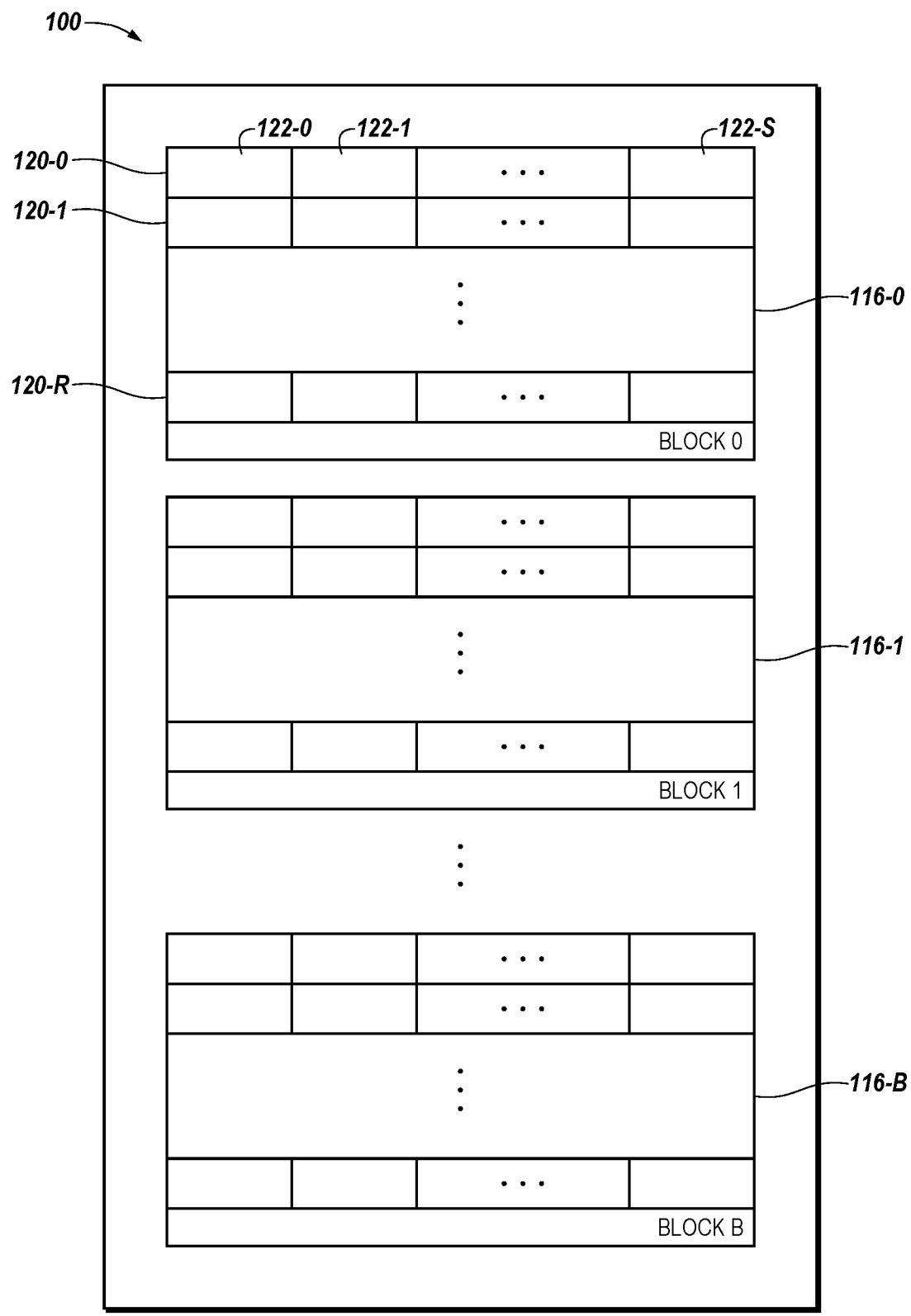
FIG. 1 illustrates a diagram of a portion of a memory array having a number of physical blocks in accordance with a number of embodiments of the present disclosure.

Apparatuses and methods for memory management are provided. In one or more embodiments of the present disclosure, an apparatus for memory management may include a memory comprising a plurality of mixed mode blocks and a controller. The controller may be configured to identify a particular mixed mode block for an erase operation and, responsive to a determined intent to subsequently write the particular mixed mode block in a single level cell (SLC) mode, perform the erase operation in the SLC mode. As used herein, "mixed mode blocks" are blocks (e.g., memory blocks, memory cells, etc.) that can be operated in either an SLC mode or an XLC mode. The endurance and/or wear ratio of the mixed mode blocks may be affected by which mode the mixed mode block is operated in. For example, mixed mode blocks may have a higher performance and/or a higher endurance when operated in an SLC mode as opposed to when they are operated in an XLC mode.

As used here, "wear ratio" refers to the number of SLC writes of a mixed mode block in SLC mode that results in the same cell degradation caused by the number of writes in XLC mode. For example, for a wear ration of 2, two write cycles in the SLC mode would result in a same amount of cell degradation as one write cycle in an XLC mode. In some embodiments, the life of a mixed mode block may be measured in terms of XLC program (e.g., write) cycles and/or erase cycles. In examples where the cell degradation is the same for an SLC mode write as it is for an XLC mode write, writing data to a cell in the SLC mode may have a same endurance cost as writing data to a cell in an XLC mode. For a wear ratio greater than 1, multiple SLC writes may be performed to a memory block with an equivalent endurance cost of one XLC mode writing operation.

Memory management (e.g., managing high SLC endurance and lesser SLC wear requirements on multi-cursor dynamic SLC cache architecture) in accordance with the present disclosure can increase the performance (e.g., increase the speed) and/or increase the endurance (e.g., increase the lifetime) of the memory, among other benefits. Further, memory management schemes in accordance with the present disclosure can reduce the endurance requirement and/or erase latencies associated with XLC modes of operation. Further, memory management schemes in accordance with the present disclosure can improve the write performance of a memory and/or increase the total bytes written (TBW) of the memory. As used herein, "endurance" refers to a measure of the useful life of memory (e.g., number of program operations and/or erase cycles that a memory block can experience without experiencing data retention and/or read issues.

Memory management schemes in accordance with the present disclosure can increase the performance and/or endurance of the memory as compared with previous memory management approaches. For example, a number of previous memory block management approaches may utilize only a single SLC low endurance write trim, and may be inadequate in a multi-cursor architecture such as a multi-cursor dynamic SLC cache. As used herein, a "dynamic SLC cache" refers to a cache that can be dynamically resized using mixed mode blocks that constitute the bulk of the advertised user size of the drive/card. For example, a size (e.g., number of blocks associated with) a dynamic SLC cache may be changed on the fly to accommodate various demands on the memory.

In some embodiments, various trims may also be used to alter the endurance and/or wear ratio of SLCs and/or XLCs. For example, a trim that yields a high endurance may be used for SLCs in some situations, and a trim that yields high wear ratios may be used for SLCs in some other situations. However, alternating between multiple trims may not be desirable, because the frequency at which firmware may toggle between system tables and user blocks may make alternating between multiple trims unstable and/or effect write speeds. In some embodiments, a trim that strikes a balance between a high endurance and a high wear ratio may be used.

As an additional example, a number of previous approaches may employ one SLC write trim for high endurance and a second SLC write trim for wear ratio; however, this may be inadequate and/or inefficient due to the frequency with which firmware toggles between system tables and user blocks. In contrast to a single cursor architecture, where garbage collection operations and host data writes and system table writes are performed on a single open block (e.g., a single cursor), multi-cursor refers to an architecture where different open memory blocks (e.g., cursors) may have different operations performed thereon. For example, in a multi-cursor architecture, a first open memory block may be used for host data writes, a second open block may be used for folding and/or garbage collection operations, a third open block may be used for system table writes, etc.

In contrast to some prior approaches, embodiments of the present disclosure may provide for reduced mixed mode block endurance requirements and/or erase latencies with a single SLC trim set. For example, in a multi-cursor memory architecture, system tables may be associated with a dedicated cursor, which may alleviate some of the challenges associated with some previous approaches described above. In addition, in some embodiments, this reduced endurance requirement may allow for improvement to the write performance and/or an increase in the total bytes written (TBW) for the memory. In some embodiments, memory blocks in the memory may be allocated into different groups or pools, with each group or pool corresponding to particular types of memory blocks. For example, one group may contain memory blocks that have been erased in SLC mode, another group may contain memory blocks that have been erased in an XLC mode, and another group may contain memory blocks are ready to be erased.

In some embodiments, a multi-cursor architecture may allow for system tables to be assigned to a dedicated cursor that comprises SLC reserved memory blocks. This may reduce an endurance burden associated with assigning system tables to user data memory blocks, and may increase the TBW of the memory device.

As used herein, "a number of" something can refer to one or more such things. For example, a number of memory cells can refer to one or more memory cells. Additionally, the designators "N", "B", "R", and "S", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 208 may reference element "08" in FIG. 2, and a similar element may be referenced as 308 in FIG. 3.

FIG. 1 illustrates a diagram of a portion of a memory array 100 having a number of physical blocks in accordance with a number of embodiments of the present disclosure. Memory array 100 can be, for example, a NAND flash memory array. However, embodiments of the present disclosure are not limited to a particular type of memory or memory array. For example, memory array 100 can be a DRAM array, an RRAM array, or a PCRAM array, among other types of memory arrays. Further, although not shown in FIG. 1, memory array 100 can be located on a particular semiconductor die along with various peripheral circuitry associated with the operation thereof.

As shown in FIG. 1, memory array 100 has a number of physical blocks 116-0 (BLOCK 0), 116-1 (BLOCK 1), . . . , 116-B (BLOCK B) of memory cells. The memory cells can be single level cells and/or extra level cells such as, for instance, triple level cells (TLCs) or quadruple level cells (QLCs). As used herein, the term extra level cell (XLC) may be used to refer to generally multilevel cells such as MLCs, TLCs, QLCs, etc. The number of physical blocks in memory array 100 may be 128 blocks, 512 blocks, or 1,024 blocks, but embodiments are not limited to a particular multiple of 128 or to any particular number of physical blocks in memory array 100. A first number of blocks 116-0, 116-1, . . . , 116-B can be allocated as a first portion or pool of memory blocks, a second number of blocks 116-0, 116-1, . . . , 116-B can be allocated as a second portion or pool of memory blocks, and/or a third number of blocks 116-0, 116-1, . . . , 116-B can be allocated as a third portion or pool of memory blocks.

A number of physical blocks of memory cells (e.g., blocks 116-0, 116-1, . . . , 116-B) can be included in a plane of memory cells, and a number of planes of memory cells can be included on a die. For instance, in the example shown in FIG. 1, each physical block 116-0, 116-1, . . . , 116-B can be part of a single die. That is, the portion of memory array 100 illustrated in FIG. 1 can be die of memory cells.

As shown in FIG. 1, each physical block 116-0, 116-1, . . . , 116-B contains a number of physical rows (e.g., 120-0, 120-1, . . . , 120-R) of memory cells coupled to access lines (e.g., word lines). The number of rows (e.g., word lines) in each physical block can be 32, but embodiments are not limited to a particular number of rows 120-0, 120-1, . . . , 120-R per physical block. Further, although not shown in FIG. 1, the memory cells can be coupled to sense lines (e.g., data lines and/or digit lines).

Each row 120-0, 120-1, . . . , 120-R can include a number of pages of memory cells (e.g., physical pages). A physical page refers to a unit of programming and/or sensing (e.g., a number of memory cells that are programmed and/or sensed together as a functional group). In the embodiment shown in FIG. 1, each row 120-0, 120-1, . . . , 120-R comprises one physical page of memory cells. However, embodiments of the present disclosure are not so limited. For instance, in a number of embodiments, each row can comprise multiple physical pages of memory cells (e.g., one or more even pages of memory cells coupled to even-numbered bit lines, and one or more odd pages of memory cells coupled to odd numbered bit lines). Additionally, for embodiments including XLCs, a physical page of memory cells can store multiple pages (e.g., logical pages) of data, for example, an upper page of data and a lower page of data, with each cell in a physical page storing one or more bits towards an upper page of data and one or more bits towards a lower page of data.

A program operation (e.g., a write operation) can include applying a number of program pulses (e.g., 16V-20V) to a selected word line in order to increase the threshold voltage (Vt) of the selected cells coupled to that selected word line to a desired program voltage level corresponding to a target (e.g., desired) data state. A sense operation, such as a read or program verify operation, can include sensing a voltage and/or current change of a sense line coupled to a selected cell in order to determine the data state of the selected cell.

In a number of embodiments of the present disclosure, and as shown in FIG. 1, a page of memory cells can comprise a number of physical sectors 122-0, 122-1, . . . , 122-S (e.g., subsets of memory cells). Each physical sector 122-0, 122-1, . . . , 122-S of cells can store a number of logical sectors of data (e.g., data words). Additionally, each logical sector of data can correspond to a portion of a particular page of data. As an example, a first logical sector of data stored in a particular physical sector can correspond to a logical sector corresponding to a first page of data, and a second logical sector of data stored in the particular physical sector can correspond to a second page of data. Each physical sector 122-0, 122-1, . . . , 122-S, can store system and/or user data, and/or can include overhead data, such as error correction code (ECC) data, logical block address (LBA) data, and recurring error data.

Logical block addressing is a scheme that can be used by a host for identifying a logical sector of data. For example, each logical sector can correspond to a unique logical block address (LBA). Additionally, an LBA may also correspond to a physical address. A logical sector of data can be a number of bytes of data (e.g., 256 bytes, 512 bytes, or 1,024 bytes). However, embodiments are not limited to these examples.

It is noted that other configurations for the physical blocks 116-0, 116-1, . . . , 116-B, rows 120-0, 120-1, . . . , 120-R, sectors 122-0, 122-1, . . . , 122-S, and pages are possible. For example, rows 120-0, 120-1, . . . , 120-R of physical blocks 116-0, 116-1, . . . , 116-B can each store data corresponding to a single logical sector which can include, for example, more or less than 512 bytes of data.

Figure 2:
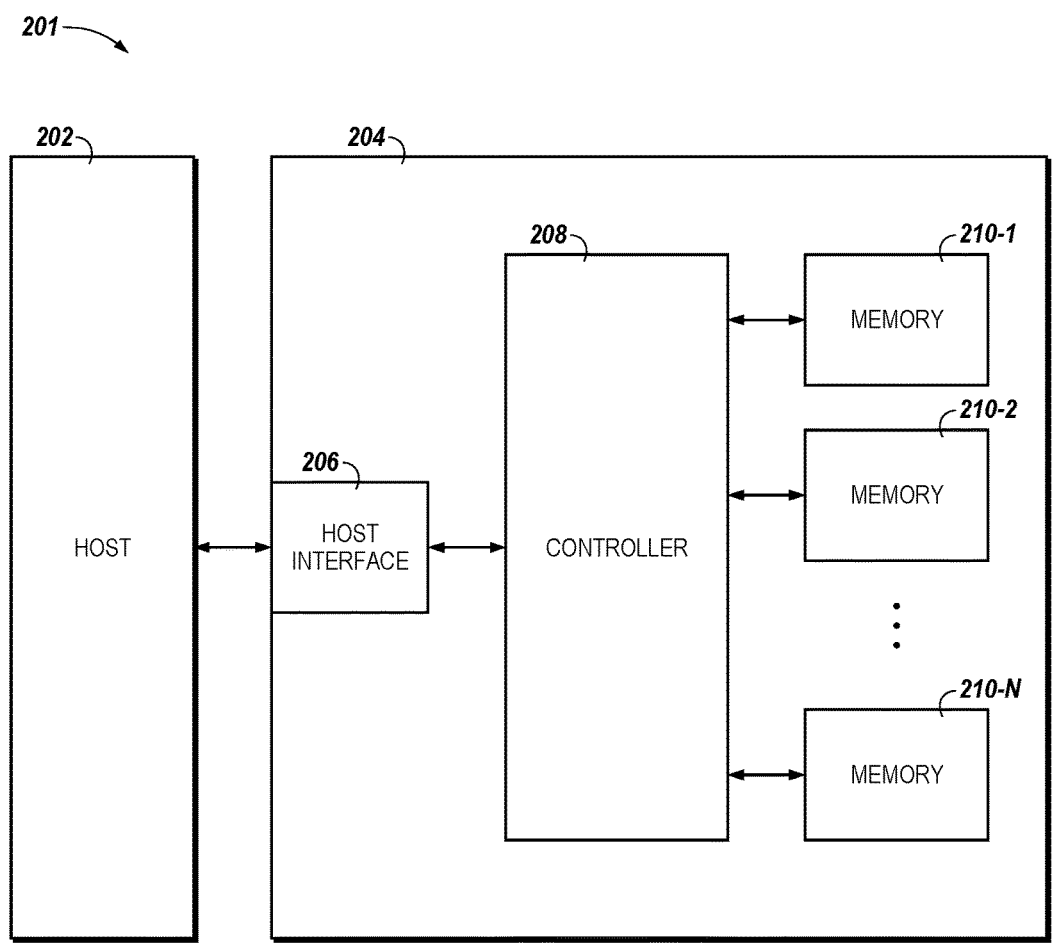
FIG. 2 is a functional block diagram of an apparatus in the form of a computing system comprising a memory system in accordance with a number of embodiments of the present disclosure.

FIG. 2 is a functional block diagram of an apparatus in the form of a computing system 201 comprising a memory system 204 in accordance with a number of embodiments of the present disclosure. As used herein, an "apparatus" can refer to, but is not limited to, any of a variety of structures or combinations of structures, such as a circuit or circuitry, a die or dice, a module or modules, a device or devices, or a system or systems, for example.

Memory system 204 can be, for example, a solid state drive (SSD). In the embodiment illustrated in FIG. 2, memory system 204 includes a host interface 206, a memory (e.g., a number of memory devices 210-1, 210-2, . . . , 210-N) (e.g., solid state memory devices), and a controller 208 (e.g., an SSD controller) coupled to physical host interface 206 and memory devices 210-1, 210-2, . . . , 210-N.

Memory devices 210-1, 210-2, . . . , 210-N can include, for example, a number of non-volatile memory arrays (e.g., arrays of non-volatile memory cells). For instance, memory devices 210-1, 210-2, . . . , 210-N can include a number of memory arrays analogous to memory array 100 previously described in connection with FIG. 1.

In some embodiments, the memory devices 210-1, . . . , 210-N can include a number of arrays of memory cells (e.g., non-volatile memory cells). The arrays can be flash arrays with a NAND architecture, for example. However, embodiments are not limited to a particular type of memory array or array architecture. As described above in connection with FIG. 1, the memory cells can be grouped, for instance, into a number of blocks including a number of physical pages of memory cells. In a number of embodiments, a block refers to a group of memory cells that are erased together as a unit. A number of blocks can be included in a plane of memory cells and an array can include a number of planes. As one example, a memory device may be configured to store 8 KB (kilobytes) of user data per page, 128 pages of user data per block, 2048 blocks per plane, and 16 planes per device.

In operation, data can be written to and/or read from a memory device of a memory system (e.g., memory devices 210-1, . . . , 210-N of memory system 204) as a page of data, for example. As such, a page of data can be referred to as a data transfer size of the memory system. Data can be transferred to/from a host 202) in data segments referred to as sectors (e.g., host sectors). As such, a sector of data can be referred to as a data transfer size of the host. In some embodiments, NAND blocks may be referred to as erase blocks, with blocks being a unit of erasure and pages being a measure of reads and/or writes.

Host interface 206 can be used to communicate information between memory system 204 and another device such as a host 202. Host 202 can include a memory access device (e.g., a processor). As used herein, "a processor" can intend a number of processors, such as a parallel processing system, a number of coprocessors, etc. Example hosts can include personal laptop computers, desktop computers, digital cameras, digital recording and playback devices, mobile (e.g., smart) phones, PDAs, memory card readers, interface hubs, and the like.

Host interface 206 can be in the form of a standardized physical interface. For example, when memory system 204 is used for information storage in computing system 201, host interface 206 can be a serial advanced technology attachment (SATA) physical interface, a peripheral component interconnect express (PCIe) physical interface, or a universal serial bus (USB) physical interface, among other physical connectors and/or interfaces. In general, however, host interface 206 can provide an interface for passing control, address, information (e.g., data), and other signals between memory system 204 and a host (e.g., host 202) having compatible receptors for host interface 206.

Controller 208 can include, for example, control circuitry and/or logic (e.g., hardware and firmware). Controller 208 can be included on the same physical device (e.g., the same die) as memories 210-1, 210-2, . . . , 210-N. For example, controller 208 can be an application specific integrated circuit (ASIC) coupled to a printed circuit board including physical host interface 206 and memories 210-1, 210-2, . . . , 210-N. Alternatively, controller 208 can be included on a separate physical device that is communicatively coupled to the physical device that includes memories 210-1, 210-2, . . . , 210-N. In a number of embodiments, components of controller 208 can be spread across multiple physical devices (e.g., some components on the same die as the memory, and some components on a different die, module, or board) as a distributed controller.

Controller 208 can communicate with memory devices 210-1, 210-2, . . . , 210-N to sense (e.g., read), program (e.g., write), and/or erase information, among other operations. Controller 208 can have circuitry that may be a number of integrated circuits and/or discrete components. In a number of embodiments, the circuitry in controller 208 may include control circuitry for controlling access across memory devices 210-1, 210-2, . . . , 210-N and/or circuitry for providing a translation layer (e.g., a flash translation layer) between host 202 and memory system 204.

Controller 208 can control operation of a dedicated region, such as a block addressing portion, of each respective memory device 210-1, 210-2, . . . , 210-N as (e.g., configure a portion of each respective memory devices 210-1, 210-2, . . . , 210-N to operate as) a static (e.g., dedicated) single level cell (SLC) cache and/or a dynamic SLC cache. For example, a portion of each respective memory device 210-1, 210-2, . . . , 210-N can be configured to operate as a static cache in SLC mode and/or a dynamic cache in SLC mode. This portion of each respective memory device 210-1, 210-2, . . . , 210-N can be, for example, a first plurality of blocks (e.g., physical blocks) of memory cells in each respective memory, as will be further described herein (e.g., in connection with FIG. 3), and may be referred to herein as a first portion of the memory. In addition, portions of each respective memory device 210-1, 210-2, . . . , 210-N can include a second plurality of blocks, a third plurality of blocks, etc.

To ensure the highest possible endurance is available for portions of the memory that are written and/or will be written in SLC mode, portions of the memory may be erased in the SLC mode, as SLC erase operations (e.g., erase operations performed in SLC mode) are less destructive than XLC (e.g., TLC, QLC, etc.) erase operations. For example, in a number of embodiments, the memory cells of the first portion (e.g., the memory cells of the first plurality of blocks) can be erased in SLC mode, and in a number of embodiments, the memory cells of the first portion can be written in SLC mode. In both such embodiments, controller 208 can perform erase operations, as well as program and sense operations, on the cells in SLC mode. In some embodiments, the first portion may be configured to achieve a highest possible endurance, and may be used to write system tables, for example. The portion of the memory allocated to system tables may be outside a portion of the memory that is allocated to user data (e.g., a user size).

As used herein, XLC memory (e.g., XLCs) can refer to memory (e.g. memory cells) that can be programmed to a targeted one of more than two data states (e.g., memory cells that can store more than a single bit of data). For example, XLC memory can refer to memory cells that store two bits of data per cell (e.g., MLCs), memory cells that store three bits of data per cell (e.g., TLCs), and/or memory cells that store four bits of data per cell (e.g., QLCs).

Figure 3:
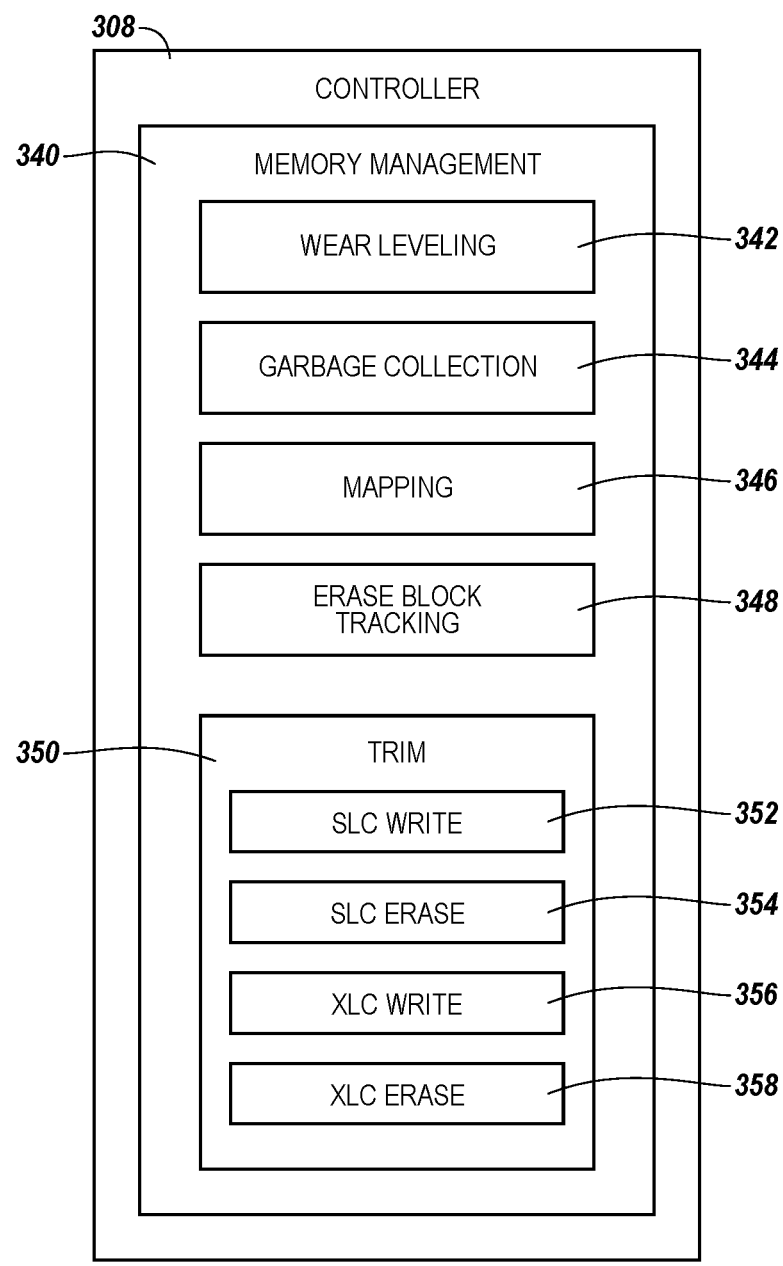
FIG. 3 illustrates a diagram of a controller in accordance with a number of embodiments of the present disclosure.

The second portion of each respective memory 210-1, 210-2, . . . , 210-N can be, for example, a second plurality of blocks (e.g., physical blocks) of memory cells in each respective memory, as will be further described herein (e.g., in connection with FIG. 3). Controller 208 can perform erase operations, as well as program and sense operations, on the cells of the second portion in SLC or XLC mode.

The size of the second portion of each respective memory 210-1, 210-2, . . . , 210-N can correspond to the quantity of memory cells used by that memory to program data stored in the SLCs of the memory to the XLCs of the memory (e.g., to fold the SLC data to the XLCs). In some embodiments, the first portion may include static blocks that are used for system tables (e.g., system tables outside the user size), and the second portion may include mixed mode user data blocks. The size of the second portion may be configured to support a first amount of user data size in an XLC mode, and the remaining amount of user data size in an SLC mode. In some embodiments, a mixed mode block may be interchangeable and may therefore be used in the SLC mode to the XLC mode.

In some embodiments, the static SLC blocks are never programmed in XLC mode. For example, in some embodiments, SLC endurance of the static SLC blocks may be increased without regard to XLC wear ratio. Accordingly, mixed mode blacks may be used interchangeably in the SLC mode or the XLC mode. In some embodiments, when using a mixed mode block in the SLC mode, XLC wear ratio may be increased without regard to SLC endurance. In some embodiments, a high SLC endurance without regard to XLC wear ratio may be achieved for static SLC blocks, while a low SLC endurance combined with high XLC ratio may be achieved for mixed mode blocks. The low SLC endurance combined with a high XLC wear ratio may be achieved for mixed mode blocks using a single SLC trim set. In some embodiments, a mixed mode block erased in XLC mode can be used to program in SLC mode, and a mixed mode block erased in SLC mode may not be used to program in XLC mode.

In some embodiments, the controller 208 may be configured to determine that a particular memory block associated with a memory block among the plurality of memory blocks is to be written in a single level cell (SLC) mode, and erase data stored in the particular memory block in the SLC mode in response to the determination that the particular memory block is to be written in the SLC mode. The particular memory block may be a host memory block and/or may have been written in an XLC mode prior to the determination that the particular block is to be written in the SLC mode.

In some embodiments, the controller 208 may be configured to increment an SLC erase counter for the particular memory block in response to the data stored in the particular block being erased in the SLC mode. In at least one embodiment, at least one memory block among the plurality of memory blocks may be erased during idle time of the apparatus 204.

The controller 208 may be configured to write data to the particular memory block in the SLC mode after the data stored in the particular memory block is erased in the SLC mode. The controller 208 may be configured to determine a free block count for memory blocks among the plurality of memory blocks. In some embodiments, foreground garbage collection may be invoked in response to the free block count being reduced to below a threshold number of free blocks.

The embodiment illustrated in FIG. 2 can include additional circuitry, logic, and/or components not illustrated so as not to obscure embodiments of the present disclosure. For example, memory device 204 can include address circuitry to latch address signals provided over I/O connectors through I/O circuitry. Address signals can be received and decoded by a row decoders and column decoders, to access memories 210-1, 210-2, . . . , 210-N.

FIG. 3 illustrates a diagram of a controller 308 in accordance with a number of embodiments of the present disclosure. The controller may be analogous to controller 208 illustrated in FIG. 2, and may be coupled to a host interface and/or a plurality of memory devices, as illustrated in FIG. 2, herein.

The controller 308 may include a memory management component 340, which may comprise a wear leveling 342 component, a garbage collection 344 component, a mapping 346 component and an erase block tracking 348 component. In some embodiments, the memory management 340 component may further include a trim 350 component, which may include an SLC write 352 component, an SLC erase 354 component, an XLC write 356 component, and an XLC erase 358 component.

In some embodiments, the wear leveling 342 component may be configured to implement wear leveling on one or more blocks associated with the memory device(s) (e.g., memory device(s) 210-1, . . . , 210-N illustrated in FIG. 2) to control the wear rate of such memory devices. Wear leveling may reduce the number of process cycles (e.g., program and/or erase cycles) performed on a particular groups of blocks by spreading such cycles more evenly over an entire memory array and/or memory device. Wear leveling can include static wear leveling and/or dynamic wear leveling to minimize the amount of valid blocks moved to reclaim a block. For example, static wear leveling may include writing static data to blocks that have high program/erase counts to prolong the life of the block. In some embodiments, wear leveling may include garbage collection operations, which may be implemented by garbage collection 344 component.

Garbage collection may include reclaiming (e.g., erasing and making available for programming) blocks that have the most invalid pages among blocks in the memory device(s). In some embodiments, garbage collection may include reclaiming blocks with more than a threshold amount (e.g., quantity) of invalid pages. However, if sufficient free blocks exist for a programming operation, then a garbage collection operation may not occur. Garbage collection may generally be performed in the background (e.g., during idle time of the memory); however, in some embodiments, garbage collection may be performed in foreground, for instance in response to a determination that an amount of free blocks has decreased below a threshold free block count.

In some embodiments, the memory management 340 component may include a mapping 346 component that may be configured to control mapping of memory blocks in the memory device(s). For example, the mapping 346 component may be configured to map bad blocks that discovered during wear leveling and/or garbage collection operations to blocks that may still accept valid data.

In some embodiments, the controller 308 may be configured to control wear leveling utilizing information that may be determined by the erase block tracking 348 component. For example, the erase block tracking 348 component may be configured to increment a counter associated with each block in response to the block being written and/or erased. In some embodiments, the erase block tracking 348 component may be configured to increment the counter by a different value in response to the block being written or erased in an SLC mode than when the block is written and/or erased in an XLC mode. For example, the erase block tracking 348 component may be configured to increment the counter associated with a particular block by a first value in response to the particular block being written and/or or erased in the SLC mode, and to increment the counter associated with the particular block by a second value in response to the particular block being written and/or erased in an XLC mode.

The memory management 340 component may further include a trim 350 component. The trim 350 component may include an SLC write 352 component, an SLC erase 354 component, an XLC write 356 component, and/or an XLC erase 358 component. The SLC write 352 component, SLC erase 354 component, XLC write 356 component, and/or XLC erase 358 component may be configured to provide different trims to various blocks based on whether the block is to be (or has been) written and/or erased in an SLC mode or in an XLC mode. In some embodiments, the SLC write 352 component may be used to write SLC data to SLC reserved blocks and to mixed mode blocks using a same trim set.

Figure 4:
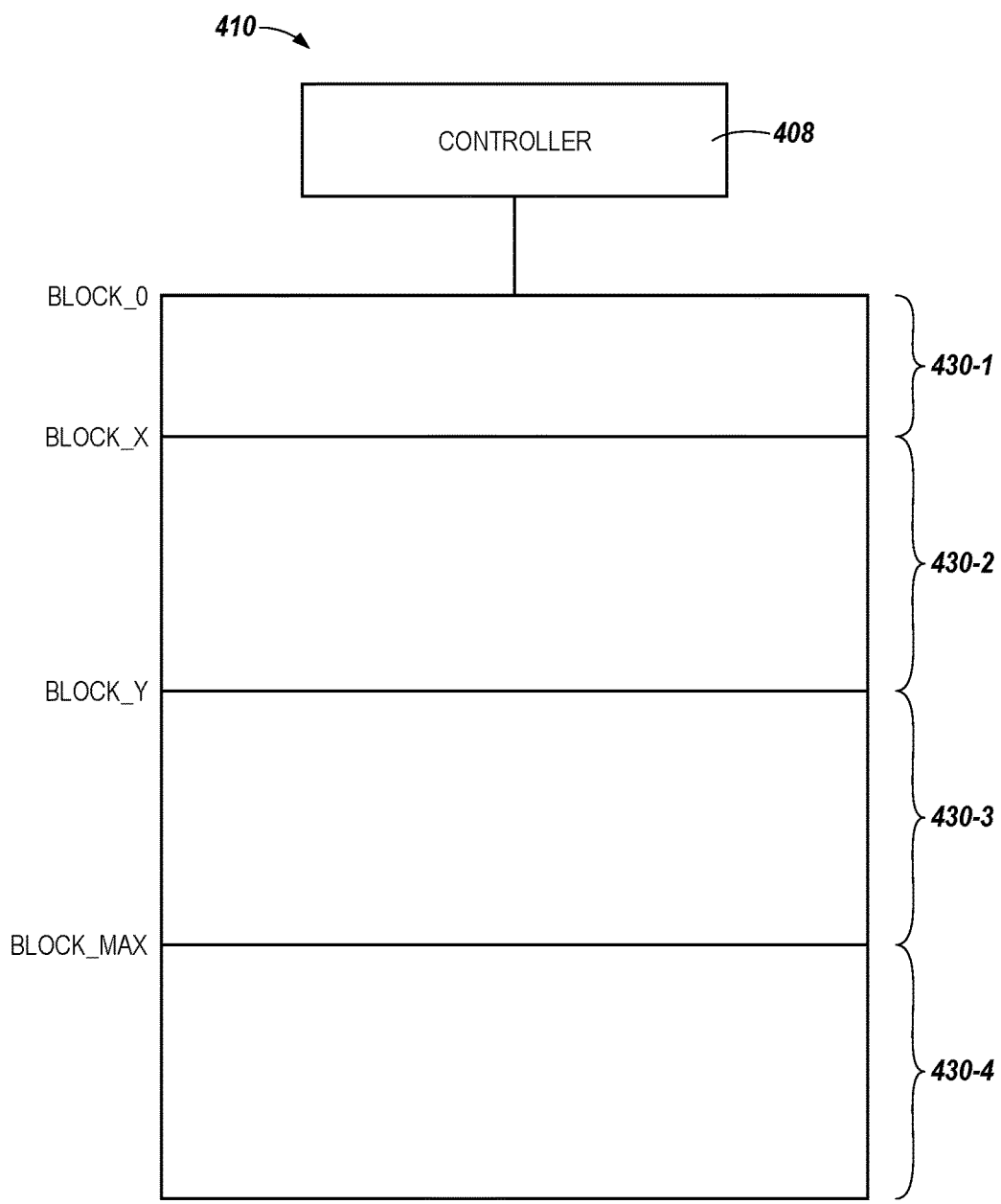
FIG. 4 illustrates a diagram of a memory having various portions in accordance with a number of embodiments of the present disclosure.

FIG. 4 illustrates a diagram of a memory 410 in accordance with a number of embodiments of the present disclosure. In some embodiments the memory 410 or a portion of the memory 410 can serve as a dynamic SLC cache. Memory 410 can be analogous to memory devices 210-1, 210-2, . . . , 210-N previously described in connection with FIG. 2, or may be a portion of memory devices 210-1, 210-2, . . . , 210-N previously described in connection with FIG. 2. In some embodiments, memory 410 can include a number of memory arrays analogous to memory array 100 previously described in connection with FIG. 1.

As shown in FIG. 4, memory 410 can include a first portion 430-1, a second portion 430-2, and a third portion 430-3. Each respective portion 430-1, 430-2, 430-3 can include a number of blocks (e.g., physical blocks) of memory cells (e.g., portion 430-1 can include a first number of blocks, portion 430-2 can include a second number of blocks, and portion 430-3 can include a third number of blocks). For instance, in the example illustrated in FIG. 4, portion 430-1 can include Block_0 through Block_X−1 of memory 410, portion 430-2 can include Block_X through Block_Y−1 of memory 410, and portion 430-3 can include Block_Y through Block_Max of memory 410.

As shown in FIG. 4, at least a portion (e.g., portion 430-1) can be smaller (e.g., include fewer blocks of memory cells) than portions 430-2 and 430-3. However, embodiments of the present disclosure are not limited to a particular size for (e.g., number of blocks in) portions 430-1, 430-2, and 430-3. For example, the portions 430-1, 430-2, and 430-3 may be the same size (e.g., may comprise a same number of memory blocks), portion 430-2 may be smaller than portions 430-1 and 430-3 and/or portion 430-3 may be smaller than portions 430-1 and 430-2. Further, although portions 430-1, 430-2, and 430-4 are illustrated as contiguous areas (e.g., as comprising contiguous blocks of memory cells) in FIG. 4, embodiments of the present disclosure are not so limited (e.g., portions 430-1, 430-2, and/or 430-3 may comprise non-contiguous blocks of memory cells).

In some embodiments, each portion 430-1, 430-2, 430-3 can represent a set or pool of memory blocks. For example, first portion 430-1 may represent a first set or pool of memory blocks, second portion 430-2 may represent a second set or pool of memory blocks, and third portion 430-3 may represent a third set or pool of memory blocks. In some embodiments, each set or pool of memory blocks may comprise memory cells with particular features and/or may comprise memory cells with particular types of data.

For example, the first portion 430-1 of memory blocks may include memory cells that have been erased in a SLC mode. The second portion 430-2 of memory blocks may include memory cells that have been erased in an XLC mode, and the third portion 430-3 of memory blocks may include memory cells that are ready to be erased. For example, the third portion 430-3 of memory blocks may include memory cells that do not contain valid data (e.g., memory blocks that do not contain valid host data) that have not yet been erased, but are ready to be erased.

In some embodiments, the size of the second set of memory blocks (e.g., the set of memory blocks that have been erased in an XLC mode) may be set to be equal to a refresh block count. As used herein, a "refresh block count" is a block count that is equal to a threshold number of free memory blocks. The refresh block count may be configurable and/or may be set by a user.

In some embodiments, garbage collection operations may not be invoked unless the free block count is reduced to a number of blocks less than the refresh block count. As an example, the free block count may be set to five memory blocks. In this example, if there are five or more free memory blocks available, garbage collection operations will not be performed; however, if the number of free memory blocks is reduce to, for example, four memory blocks, garbage collection operations may be performed.

In some embodiments, various modules may move data from source blocks to XLC target blocks as part of garbage collection operations. The modules may include read disturb, retention, static wear leveling, and/or read error handling modules. The source memory blocks that are freed during garbage collection operations may be added to the second portion 430-2 of memory blocks. In some embodiments, a number of remaining memory blocks that are freed as part of background garbage collection operations may be added to the first portion 430-1 of memory blocks. Background garbage collection operations may refer to garbage collection operations that are performed during idle time of the memory device. For example, memory blocks that are freed as part of garbage collection operations that are not added to the second portion 430-2 of memory blocks may be added to the first portion 430-1 of memory blocks.

In some embodiments, the size of the third portion 430-3 of memory blocks may (e.g., the set of memory blocks to be erased) may be set to a value that is less than the refresh block count. For example, the size of the third portion 430-3 of memory blocks may be maintained such that the number of memory blocks associated with the third portion 430-3 of memory blocks is less than the number of memory blocks associated with the second portion 430-2 of memory blocks.

In some embodiments, the first portion 430-1 may include memory cells that are erased in an SLC mode. The second portion 430-2 may include memory cells that are erased in an XLC mode, and the third portion 430-3 may include memory cells that are ready to be erased. In some embodiments, the first portion 430-1, the second portion 430-2 and/or the third portion 430-3 may include background cache memory blocks.

The memory 410 may be coupled to a controller 408. The controller 408 may be analogous to controller 208 illustrated and described in connection with FIG. 2, and controller 308 illustrated and describe in connection with FIG. 3, herein. The controller 408 may be configured to increment an SLC erase counter associated with a memory block among the first portion 430-1 of memory blocks in response to the memory block being erased in an SLC mode, and/or may be configured to increment an XLC erase counter associated with a memory block among the second portion 430-2 of memory blocks in response to the memory block being erased in the XLC mode.

In some embodiments, the controller 408 may be configured to control and/or maintain the number of memory blocks associated with each respective portion 430-1, 430-2, and 430-3. For example, the controller 408 may be configured to maintain the second portion 430-2 of memory blocks such that a number of memory blocks associated with the second portion 430-2 of memory blocks is equal to or less than a refresh block threshold limit. In another example, the controller 408 may be configured to maintain the third portion 430-3 of memory blocks such that a number of memory blocks associated with the third portion 430-3 of memory blocks is less than a number of memory blocks associated with the second portion 430-2 of memory blocks.

The controller 408 may be configured to erase the second portion 430-2 of memory blocks and subsequently write data to the second portion 430-2 of memory blocks in either an SLC mode or an XLC mode.

In some embodiments, the controller 408 may be configured to monitor memory blocks to determine an erase count for respective memory blocks. For example, the controller 408 may be configured to increment a counter associated with each memory block in response to the memory block being erased. In some embodiments, the controller 408 may increment a first counter (e.g., an SLC erase counter) associated with a particular memory block in response to the particular memory block being erased in the SLC mode. Similarly, the controller 408 may be configured to increment a second counter (e.g., an XLC erase counter) associated with the particular memory block in response to the particular memory block being erased in the XLC mode. The controller may be further configured to prioritize memory blocks for erasing and/or writing data based on the first and/or second erase counter.

In some embodiments, memory blocks associated with the second portion 430-2 may be prioritized for being erased and/or written such that memory blocks associated with the second portion 430-2 are erased and/or written prior to memory blocks in the first portion 430-1 and/or the third portion 430-3 being erased and/or written. Embodiments are not so limited; however, and in some embodiments, memory blocks associated with the first portion 430-1 may be erased and/or written prior to erasing and/or writing memory blocks associated with the second portion 430-2 and/or the third portion 430-3.

Memory blocks with erase counters (SLC erase counters and/or XLC erase counters) that have higher numbers of erases may be moved to the second portion 430-2. In some embodiments, memory blocks associated with the third portion 430-3 may not be immediately erased following garbage collection operations, and may instead be held in the third portion 430-3 until it becomes useful to erase them. Memory blocks that are associated with the third portion 430-3 that have low SLC erase counts may be moved to the first portion 430-1 and subsequently erased in the SLC mode.

For example, the controller 408 may be configured to determine that a first memory block among the third portion 430-3 of memory blocks has a lower erase count than a second memory block among the third portion 430-3 of memory blocks. The controller 408 may be further configured to erase the first memory block among the third portion 430-3 of memory blocks in the SLC mode, and add the erased first memory block to the first portion 430-1 of memory blocks. As an example, the controller 408 may be configured to allocate memory blocks to the first portion 430-1, second portion 430-2, and/or third portion 430-3 based on a respective erase count for each memory block.

In some embodiments, the blocks of portions 430-1, 430-2, and 430-3 can be configured to operate as a dynamic single level cell (SLC) cache. That is, the blocks of portions 430-1, 430-2, and 430-3 can be configured to operate as a dynamic cache in SLC mode. However, embodiments are not so limited, and the memory blocks of portion 430-1 may be configured to operate in SLC mode as a dynamic SLC cache for the lifetime of the memory 410.

Figure 5:
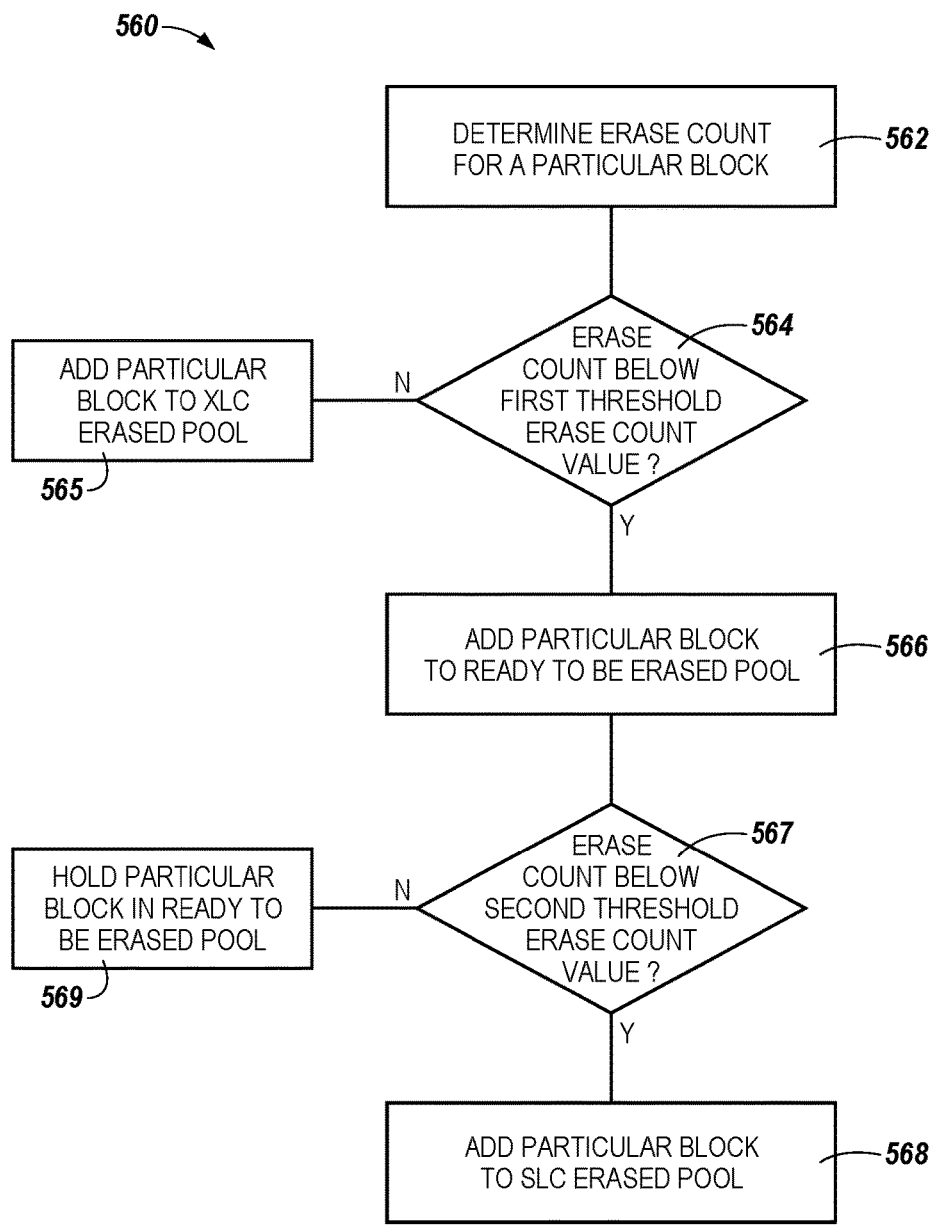
FIG. 5 illustrates an example flow diagram for memory management in accordance with a number of embodiments of the present disclosure.

FIG. 5 illustrates an example flow diagram 560 for memory management in accordance with a number of embodiments of the present disclosure. At block 562, an erase count for a particular block may be determined. For example, the number of times the particular block has been erased may be determined. In some embodiments, the number of times the particular block has been erased may include information from a counter that is incremented both when the particular block has been erased in an SLC mode and when the particular block has been erased in an XLC mode. As described above, the counter may be incremented by different values depending on whether the particular block was erased in an SLC mode or in an XLC mode.

At 564, a determination may be made whether the particular block has an erase count associated therewith that is below a threshold value. For example, it may be determined that the particular block has been erased a certain number of times in the SLC mode and a certain number of times in the XLC mode. The value of the counter may reflect the number of times the particular block has been erased in the SLC mode and the number of times the particular block has been erased in the XLC mode. If the value of the counter is not below a first threshold counter value (e.g., the particular block has been erased more times in the SLC mode and/or the XLC mode than a threshold number of combined erases), the particular block may be added at 565 to a pool of blocks that have been erased in the XLC mode.

If the value of the counter is below a threshold counter value (e.g., the particular block has been erased less times in the SLC mode and/or the XLC mode than a threshold number of combined erases), the particular block may be added at 566 to a pool of blocks that are ready to be erased. From the blocks that are in the ready to be erased pool, a determination may once again be made whether a particular block has an erase count associated therewith that is less than a second threshold erase count value.

If the particular block has been erased more times than the second threshold erase count value, the particular block may be held at 569 in the ready to be erased pool. In contrast, if the particular block has been erased less times than the second threshold erase count value, the particular block may be added at 568 to an SLC erased pool. By moving the blocks to various pools based on the erase count value associated with the particular blocks, uniform wear leveling may be achieved by using blocks from the SLC erased pool prior to using blocks from the XLC erased pool or the ready to be erased pool. Some embodiments include a method of operating a memory device in accordance with a number of embodiments of the present disclosure. The method can be performed by, for example, controller 208 previously described in connection with FIG. 2, controller 308 previously described in connection with FIG. 3, or controller 408 described in connection with FIG. 4.

The memory system can be, for example, memory devices 210-1, 210-2, . . . , 210-N previously described in connection with FIG. 2 and/or memory 410 previously described in connection with FIG. 4. That is, the memory can include a first portion (e.g., a first number of blocks), a second portion (e.g., a second number of blocks), and a third portion (e.g., a third number of blocks).

In some embodiments, the method for operating the memory device may include allocating a first portion of memory blocks associated with the memory device to be erased in a single level cell (SLC) mode, allocating a second portion of memory blocks associated with the memory device to be erased in an extra level cell (XLC) mode, and allocating a third portion of memory blocks associated with the memory device such that the third portion comprises memory cells that are ready to be erased.

The method may further include erasing memory blocks in the first portion of memory blocks in the SLC mode, and/or writing data to the memory blocks in the first portion of memory blocks in the SLC mode. In some embodiments, the method may include erasing at least one memory block in the second portion of memory blocks in the XLC mode, and/or writing data to the at least one memory block in the second portion of memory blocks in the SLC or XLC mode.

The number of memory blocks in the third portion may be maintained such that the number of memory blocks in the third portion is less than a number of memory blocks in the second portion. Garbage collection may be performed on memory blocks associated with the memory device, for example, during idle time of the memory device. In some embodiments, memory blocks that have had garbage collection operations performed thereon may be added to the first portion of memory blocks.

In some embodiments, the method may include determining that a first memory block associated with the memory device has a lower erase count than a second memory block associated with the memory device, and adding the first memory block to the first portion of memory blocks in response to the determination that the first memory block has the lower erase count than the second memory block.

In some embodiments, SLC caching may include using data blocks in mixed mode (e.g., SLC mode and XLC mode). A total number of program/erase cycles accumulated by a mixed mode block may be equal to the number of SLC program cycles used in an SLC caching mode and a number of XLC program cycles used in an XLC storage mode. Programming a block in SLC mode degrades a cell (e.g., consumes part of the lifetime of the NAND) at a smaller rate when compared to XLC mode.

As described herein, in some embodiments, a mixed mode block that is to be written in the SLC mode may be erased in the SLC mode prior to writing in the SLC mode. In some embodiments, an SLC trim set may be used while writing to a block that has been previously erased in an XLC mode.

In some embodiments, block erased in the SLC mode are not written in the XLC mode. However, by selectively erasing blocks based on whether the block is intended for SLC caching or storage, blocks may be allocated as they are needed. Although this may increase an erase latency, by allocating various portions of blocks into blocks that have been erased in SLC mode, XLC blocks, and blocks that are ready to be erased, such latencies may be mitigated.

In some embodiments, if there are either SLC erased blocks or blocks that are ready to be erased, host data may be written in the SLC mode. If there are no blocks in either of these portions, host data may be written in the XLC mode using blocks in the XLC portion.

In some embodiments, because solid state drives and mobile workloads may have frequent idle time and, as blocks are used the portions may be continuously replenished by either moving blocks from that are ready to be erased to the SLC erased portion, or by moving blocks that have comparatively lower erase counts that were garbage collected during the idle time to the SLC erased portion. This may allow for a steady portion of SLC erased blocks and XLC erased blocks to be provided. In addition, a majority of host data may be written to the SLC erased blocks, which may reduce the wear of the blocks and may allow for a higher amount of host data to be written for a given life of the blocks.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
    an array of memory cells comprising a plurality of mixed mode blocks; and
    a controller configured to:
        monitor respective erase counts corresponding to the plurality of mixed mode blocks;
        responsive to erasing a particular mixed mode block of the plurality of mixed mode blocks, incrementing an erase count corresponding to the particular block by different amounts based on whether the particular mixed mode block was erased in a single level cell (SLC) mode or an extra level cell (XLC) mode; and
        as part of a garbage collection process:
            allocate a first mixed mode block among the plurality of mixed mode blocks to a first pool of mixed mode blocks based on the respective erase count for the first mixed mode block;
            allocate a second mixed mode block among the plurality of mixed mode blocks to a second pool of mixed mode blocks based on the respective erase count for the second mixed mode block;
            allocate a third mixed mode block among the plurality of mixed mode blocks to a third pool of mixed mode blocks based on the respective erase count for the third mixed mode block; and
            determine whether to move the third mixed mode block from the third pool of mixed mode blocks to one of the first pool of mixed mode blocks and the second pool of mixed mode blocks by comparing the respective erase count for the third mixed mode block with respective erase counts for a number of other mixed mode blocks within the third pool of mixed mode blocks.

2. The apparatus of claim 1, wherein the first mixed mode block has a lower respective erase count than the respective erase count of the second mixed mode block and the respective erase count of the third mixed mode block.

3. The apparatus of claim 1, wherein the controller is configured to:
    erase blocks in the first pool of mixed mode blocks in the (SLC) mode;
    erase blocks in the second pool of mixed mode blocks in the (XLC) mode; and
    store mixed mode blocks that are ready to be erased in the third pool of mixed mode blocks.

4. The apparatus of claim 3, wherein the controller is further configured to prioritize writing data to blocks that have been erased in the XLC mode.

5. The apparatus of claim 1, wherein a number of blocks in the third pool of mixed mode blocks is less than a number of blocks in the second pool of mixed mode blocks.

* * * * *